United States Patent [19]
Dempewolf et al.

[11] Patent Number: 5,796,525
[45] Date of Patent: Aug. 18, 1998

[54] QUADAXIAL GRADIENT INDEX LENS

[75] Inventors: Joseph R. Dempewolf, Taos; Robert K. Wade, Albuquerque, both of N. Mex.

[73] Assignee: LightPath Technologies, Inc., Albuquerque, N. Mex.

[21] Appl. No.: 739,859

[22] Filed: Oct. 31, 1996

[51] Int. Cl.$^6$ .............................. G02B 3/00; G02B 13/08
[52] U.S. Cl. ....................... 359/653; 359/652; 359/654; 359/668
[58] Field of Search ............................ 359/652–655, 359/668

[56] References Cited

U.S. PATENT DOCUMENTS

| 3,894,789 | 7/1975 | Kobayashi et al. ............... 359/652 |
| 4,929,065 | 5/1990 | Hagerty et al. ................... 350/413 |

OTHER PUBLICATIONS

P.K. Manhart, *Optics and Photonics News*, pp. 44–47, (Mar. 1995).
Xiaojie J. Xu et al, "Preparation of Macro Axial Gradient Refraction Glasses", *Gradient Index Optical Systems—Topical Meeting*, Rochester, NY (Jun. 7–8, 1994).

Primary Examiner—Georgia Y. Epps
Assistant Examiner—Evelyn A. Lester
Attorney, Agent, or Firm—Benman & Collins

[57] ABSTRACT

An axially-based lens is provided, comprising two biaxial elements, each having entrance and exit surfaces. The exit surface of one of the elements is joined to the entrance surface of the other element, with one of the elements rotated at an angle with respect to the other. In a preferred embodiment, the angle of rotation is 90°. The axially-based lens thus comprises four axial sub-elements, and is called a "quadaxial" lens herein. The axially-based lens element has the ability to gather and focus light to a spot with a minimum of spherical aberration and with a substantially uniform distribution of light intensity from center to periphery of the spot. In a preferred embodiment, the lens element focuses light to a square spot size.

8 Claims, 5 Drawing Sheets

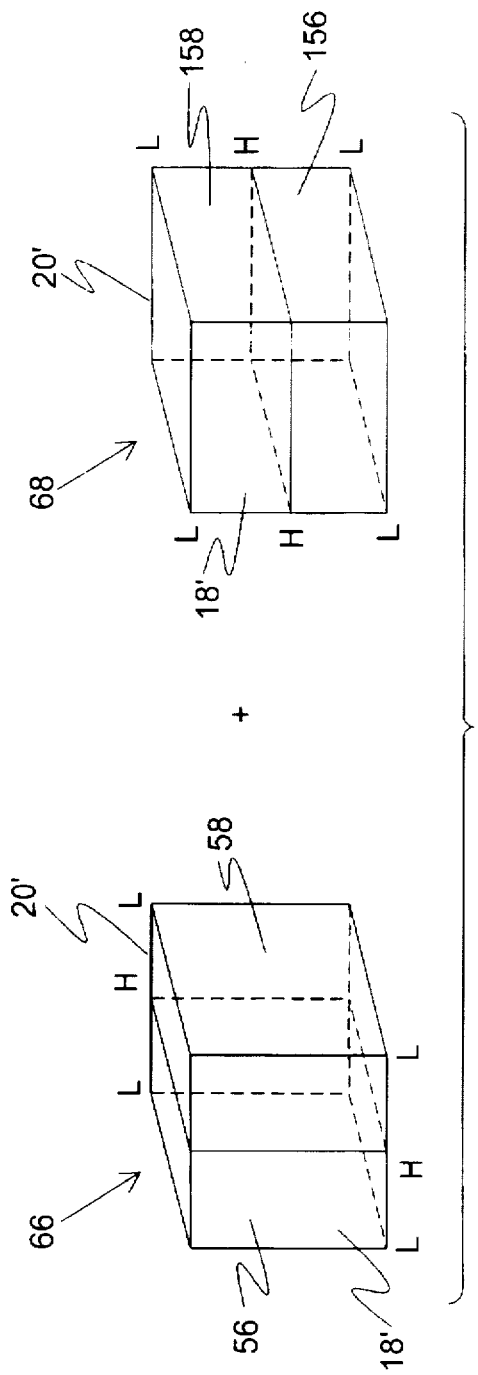
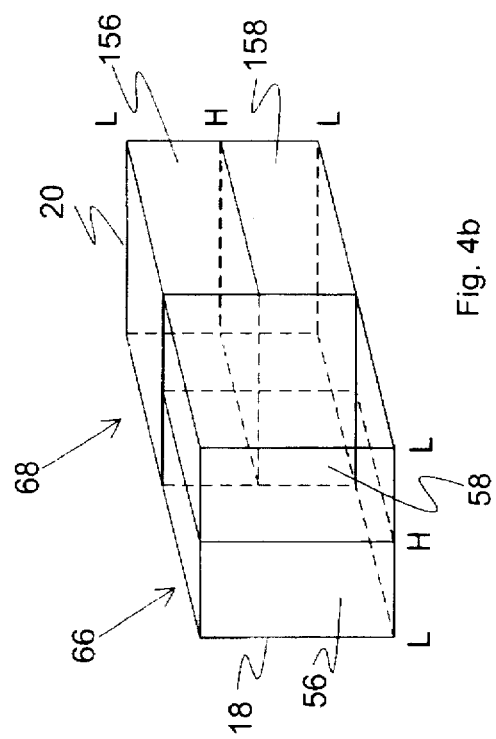

QUADAXIAL GRADIENT INDEX LENS

TECHNICAL FIELD

The present-invention relates to optical elements, and, more particularly, to lenses comprising sub-elements which have a gradient in the index of refraction along the axial direction.

BACKGROUND ART

Couplers are optical elements that join a light source, such as a laser diode, a light-emitting diode, an optical fiber, or other light source, to a light collector, such as a photo detector, an optical fiber, an optoelectronic chip, and the like.

Prior art couplers comprise either (1) homogeneous glass lenses or (2) radially-graded index of refraction glass cylinders or rods. The homogeneous glass lenses require air space and have a low numerical aperture or light collection value, which results in less light being delivered to the collector than was incident on the coupling lens. In addition, homogeneous glass lenses are incapable of correcting for spherical aberration, which results in inefficient coupling, unless an aspheric surface is formed on the lens. Finally, multiple elements are required in order to sufficiently couple the light.

The radially-graded index glass cylinder lenses function with flat surfaces and focus light at the lens exit surface, thereby overcoming one of the problems of homogeneous glass lenses. Further, the radially-graded index glass cylinder lenses comprise a single optical component, thereby overcoming another problem of homogeneous glass lenses. However, these radially-graded index glass cylinder lenses are incapable of forming small focal points, resulting in inefficient coupling performance. While coupling performance may be improved by forming a curved surface on the exit surface of the lens, the advantage of a flat surface is lost, and an air space is introduced into the coupling scheme.

In operation, the radial rod lens brings incident light to a focus, then the image diverges, refocuses, etc. until exiting the rod. The problem is that where the light is incident across the diameter of the rod determines what the distance to the focus is. That is, intermediate rays need to travel longer through the material to feel the same power effect than the outer, or marginal, rays, so these rays come to focus at a different location than the marginal (extreme) rays. At the region of the first focus, the beam spread is not as bad as with further length, but the spot size would still be quite large. The large spot size is due to spherical aberration, which would require a curved exit surface or at least one additional lens element to correct.

A gradient optical element known as a biaxial lens has been disclosed in application Ser. No. 08/400,804, filed Mar. 8, 1995. Such a biaxial lens is formed of an optical material and has plano-plano entrance and exit surfaces and an optical axis therebetween. The optical material has a refractive index varying symmetrically about a central plane containing the optical axis, with the refractive index being substantially constant in directions parallel to the central plane.

The biaxial lens is fabricated by first forming a sub-element having a gradient in index of refraction from a first surface to a second surface, both surfaces perpendicular to the entrance and exit surfaces. All surfaces of the sub-elements are flat. The sub-element thus has a gradient in index of refraction beginning at a lower value (L), and ending at a higher value (H). Two such sub-elements are joined together either along the low index surfaces or the high index surfaces to form a high-low-high (H-L-R) configuration or a low-high-low (L-H-L) configuration, respectively. Such a biaxial lens is used in place of a cylindrical lens to form a line focus.

Thus, what is needed is a lens element having the ability to gather and focus light to a spot with a minimum of spherical aberration and with a substantially uniform distribution of light intensity from center to periphery of the spot. In particular, a square spot size is needed.

DISCLOSURE OF INVENTION

In accordance with the present invention, an axially-based lens is provided, comprising two biaxial elements, each having entrance and exit surfaces. The exit surface of one of the elements is join surface of the other element, with one of the elements rotated at an angle with respect to the other. In a preferred embodiment, the angle of rotation is 90°. The axially-based lens thus comprises four axial sub-elements, and is called a "quadaxial" lens herein.

The axially-based lens element of the invention has the ability to gather and focus light to a spot with a minimum of spherical aberration and with a substantially uniform distribution of light intensity from center to periphery of the spot. In a preferred embodiment, the lens element generates a square spot size.

Other objects, features, and advantages of the present invention will become apparent upon consideration of the following detailed description and accompanying drawings, in which like reference designations represent like features throughout the FIGURES.

BRIEF DESCRIPTION OF THE DRAWINGS

The drawings referred to in this description should be understood as not being drawn to scale except if specifically noted.

FIG. 1b, on coordinates of refractive index and thickness, is a plot illustrating an exemplary index of refraction profile for the axial gradient lens shown in FIG. 1a;

FIG. 2b, on coordinates of refractive index and thickness, is a plot illustrating an exemplary index of refraction profile for the biaxial gradient lens shown in FIG. 2a;

FIG. 3b is a top plan view of the quadaxially-graded coupler component shown in FIG. 3a;

FIG. 4a is a perspective view depicting the orientation of two biaxially-graded coupler components, prior to joining them together to form the quadaxially-graded optical element of the present invention;

FIG. 4b is a perspective view of the quadaxially-graded optical element following joining together of the two biaxially-graded coupler components shown in FIG. 4a;

BEST MODES FOR CARRYING OUT THE INVENTION

Reference is now made in detail to certain specific embodiments of the present invention, which illustrates the best modes presently contemplated by the inventors for practicing the invention. Alternative embodiments are also briefly described as applicable.

Axial gradient index of refraction lenses, sometimes referred to in the prior art as GRIN lenses, are flat glass slabs with a predesigned refractive index perturbation within it which provides the functionality of analog lens array; see, e.g., P. K. Manhart, *Optics and Photonics News*, pp. 44–47, (Mar. 1995). The unique axial gradient lens fabrication technology available from LightPath Technologies, Inc. (Albuquerque, N. Mex.) has begun to revolutionize the imaging industry. The lenses are available under the trademark GRADIUM.

The fabrication of axial GRIN lens blanks has been described elsewhere; see, e.g., U.S. Pat. 4,929,065 and Xiaojie J. Xu et al, "Preparation of Macro Axial Gradient Refraction Glasses", *Gradient Index Optical Systems— Topical Meeting*, Rochester, N.Y. (Jun. 7–8, 1994), which disclose stacking a plurality of glass plates, each of a different composition, to form a stack, which is then fused at a sufficiently high temperature to cause interdiffusion of elements of the composition, thereby forming a unitary glass body. The particular profile of index of refraction, whether linear, parabolic, quadratic, cubic, etc., is achieved by control of the thicknesses and index of refractions (compositions) of the individual glass plates. Thus, a desired profile may be fabricated from a calculation of plate thickness and index of refraction, as taught in that patent.

In another approach, glass frits may be used to form the lens blank. In this case, the desired profile may be fabricated, based on the weight of frit having a particular index of refraction (composition). Knowing the density of a particular glass composition permits conversion of plate thickness to weight. This approach is the subject of a patent application, Ser. No. 08/441,275, filed May 15, 1995, and assigned to the same assignee as the present application.

The unitary glass body, or boule, that is formed by heating the glass plates or glass frits to a sufficiently high temperature for a period of time is then core-drilled to provide a plurality of glass blanks, which are then ground and polished to provide lenses. A variety of lens surfaces may be formed, including plano, concave, and convex, and combinations thereof.

Figure 1A:
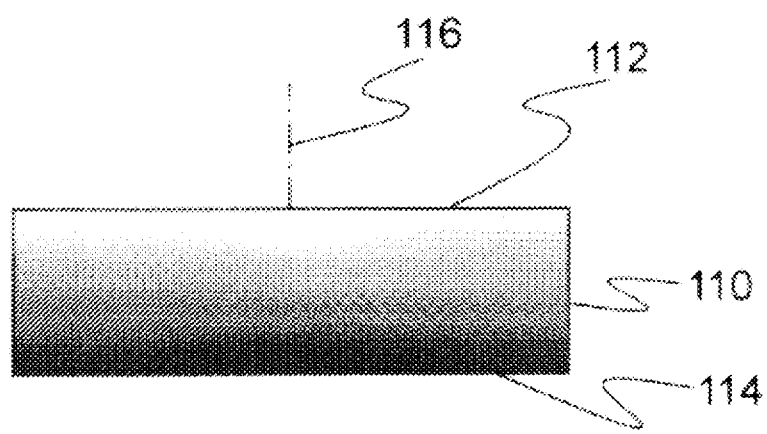
FIG. 1a depicts a prior art axial gradient lens with a prescribed variation of refractive index change.
Figure 1B:
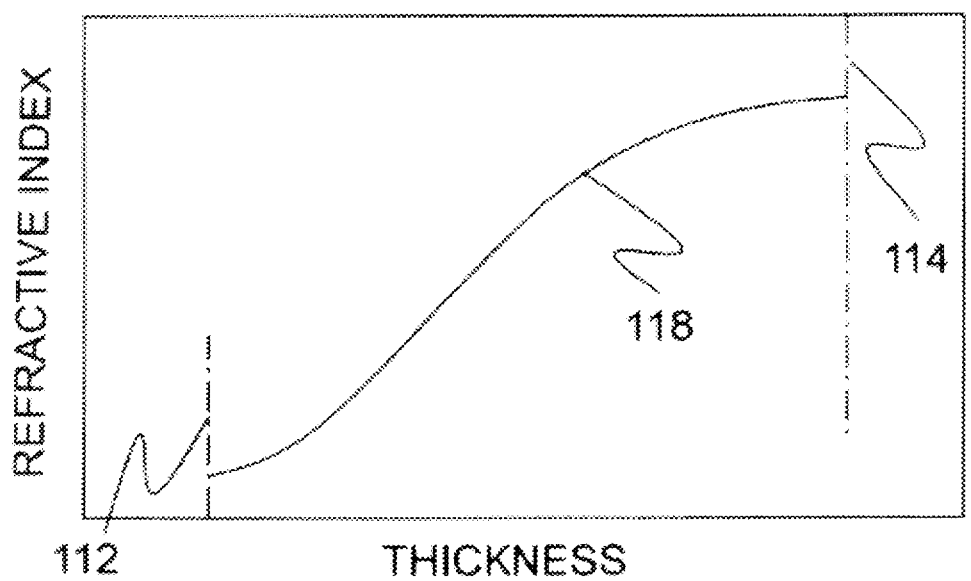

FIGS. 1a and 1b present a schematic illustration of the change in the refractive index along the axis 116 (across the cross-section). As shown in FIG. 1a, the glass blank 110 has a low index face 112 and a high index face 114. Face 112 of blank 110 is formed of a material having the lowest refractive index in the stack, while the opposite face 114 is formed of material having the highest refractive index. The index of refraction varies in some prescribed fashion between the two faces 112, 114. Preferably, the profile is parabolic. An example of a profile is depicted in FIG. 1b, which is a half-parabolic curve 118.

The next step is to carefully orient, grind, and polish the low and high index faces 112 and 114, respectively, of the glass blank 110. The optical properties, such as gradient index profile, are also normally measured during this step.

After this, the blank 110 is cut, normal to the isoindex planes, into two pieces, each having the same dimensions. To produce the biaxial element, the two pieces are joined together with either their high index faces 114 or low index faces 112 abutting. Before the surfaces are joined, however, they are preferably polished to be slightly convex. It has been found that, for a surface about 4 cm$^2$, a curvature showing 10 rings on an optical flat with green light is acceptable for this purpose. After the surfaces have been polished, they may be cleaned in an ultrasonic bath of methanol for ten minutes, rinsed with distilled water to remove mineral deposits, and thereafter, held together and heated to cause them to fuse together. Alternatively, the two surfaces can be joined together by use of an optical cement with a suitably matched index of refraction.

The cylindrical gradient lens 140 has a gradient of refractive index only along one axis 150 orthogonal to the optical axis 152 of the lens. The lens 140 has flat front and back surfaces, 142 and 144, and can act as a cylindrical lens to focus light from a two-dimensional image 146 into a line 148.

Figure 2A:
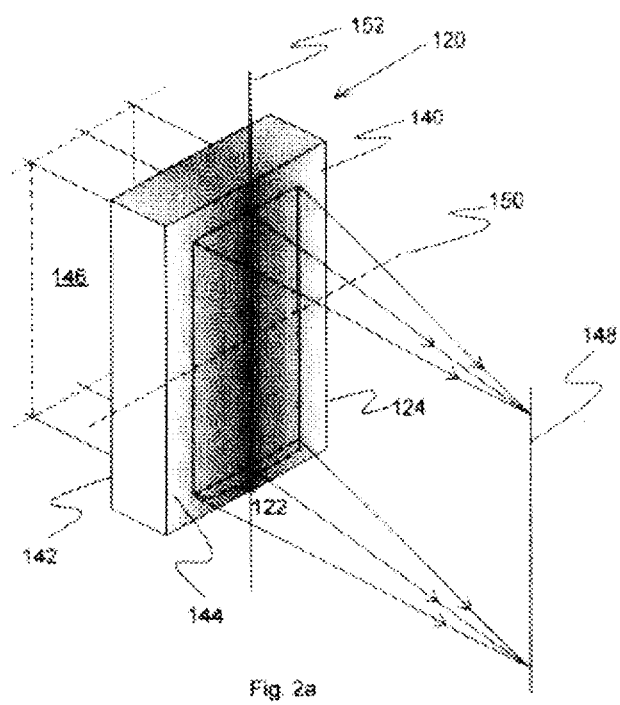
FIG. 2a depicts a prior art biaxial gradient lens comprising two axial lens elements, joined along their respective high index surfaces.
Figure 2B:
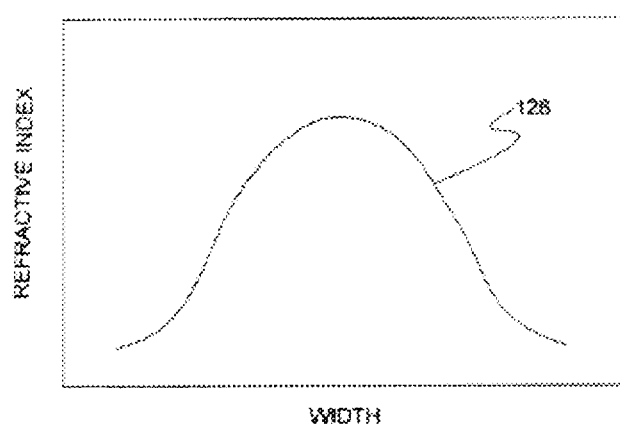

If the high index faces 114 are joined, the resulting block 120 has a central zone 122 of material having a high refractive index. From this central zone 122, the index decreases towards the ends 124 of the block 120. The resultant profile of refractive index across the width of the block 120 is represented by Curve 126 in FIG. 2b. This curve 126, as may be expected, is a combination of two of the curves 118 illustrated in FIG. 1b. In order for the block 120 to act as a cylindrical axially-graded lens that focuses light into a line such as line 148 in FIG. 2a, the curve 126 of the refractive index profile must be substantially quadratic or parabolic. However, other profile shapes may also be used for other applications.

Figure 2C:
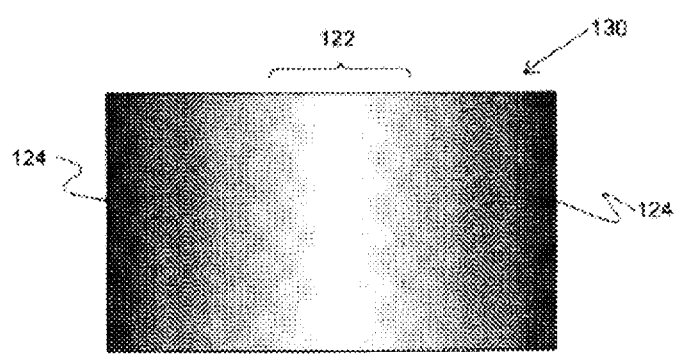
FIG. 2c depicts a prior art biaxial gradient lens comprising two axial lens elements, joined along their respective low index surfaces.

If the low index faces 112 are joined, then the resulting block or lens blank 130 of optical material is as schematically represented in FIG. 2c. In this lens blank 130, the central zone 132 has the lowest refractive index, while the outer edges 124 have the highest refractive index, opposite to the situation described immediately above. The resultant profile of refractive index is a combination of the two curves 118 shown in FIG. 1b, but the reverse of the case where the high index faces 114 are joined. Depending on the intended application, the profile may be quadratic or parabolic.

Turning now to FIGS. 3a–d and 4a–b, the quadaxially-graded optical coupler 10 is a single component 24 comprising a quadaxially graded index of refraction element having a piano entrance surface 18 and a piano exit surface 20 and the optical axis therebetween 22. The quadaxially-graded index of refraction element comprises two biaxially-graded index of refraction sub-elements 66, 68. Each subelement 66, 68 comprises two axially-graded index of refraction sub-sub-elements 56, 58 and 156, 158, respectively, having a gradient in index of refraction that beginning at a lower value (L) on one surface and ending at a higher value (H) on an opposite surface. The two sub-sub-elements 56, 58 and 156, 158 are joined together at the surfaces having the higher value of index of refraction, the joined surfaces being perpendicular to the entrance and exit surfaces 18, 20. The two biaxially graded index of refraction sub-elements 66, 68 are joined together along the exit surface 20' of one sub-element 66 to the entrance surface 18' of another sub-element 68, with one sub-element rotated 90° about the optical axis with respect to the other sub-element. The details of joining the two sub-elements 66, 68 are shown in FIGS. 4a (before joining) and 4b (after joining).

Figure 3A:
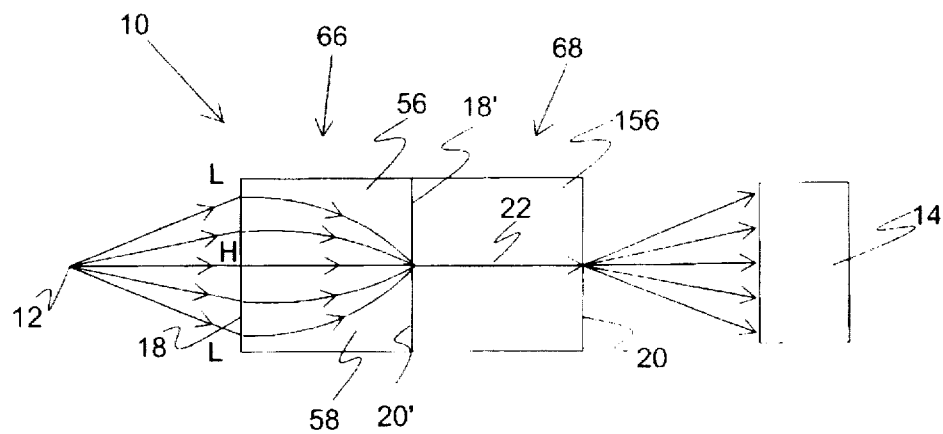
FIG. 3a is a side elevational view of a quadaxially-graded coupler component of the present invention, comprising two biaxially-graded components rotated 90 degrees with respect to each other and cemented end-to-end.
Figure 3B:
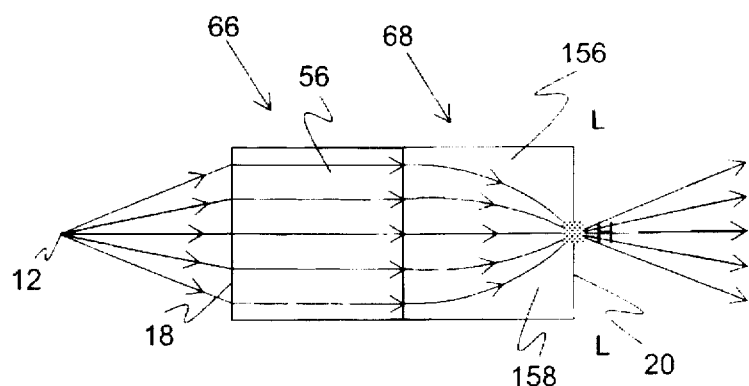
Figure 3D:
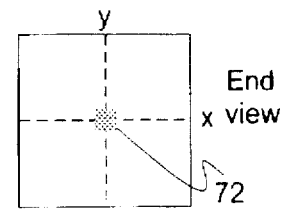
FIG. 3d is an end view of the quadaxially-graded coupler component shown in FIGS. 3a and 3b, depicting the resulting square focus spot, which arises from the use of flat, or piano, surfaces.
Figure 3C:
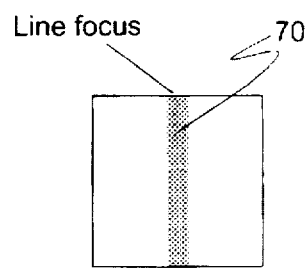
FIG. 3c is an end view of the first biaxially-graded component, depicting the resulting line focus.

Light passing through the first sub-element 66 is focused to a line 70 having a finite width, as shown in FIG. 3c. After passing through the second sub-element 68, the light is focused to a square 72, having a side length that is equal to the width of the line 70, as shown in FIG. 3d. Consequently, the output from the light source 12 is made symmetrical about the x and y axes.

Figure 3E:
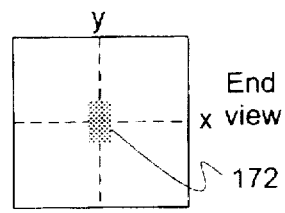
FIG. 3e is a view similar to that of FIG. 3d, but depicting a rectangular focus spot, resulting from the use of different change in index of refraction (Δn) values in the two biaxially-graded components.

In the situation in which the biaxial element 66 has a first Δn and second biaxial element 68 has a second, different, Δn, the light is focused to a rectangle 172, as shown in FIG. 3e.

Figure 5A:
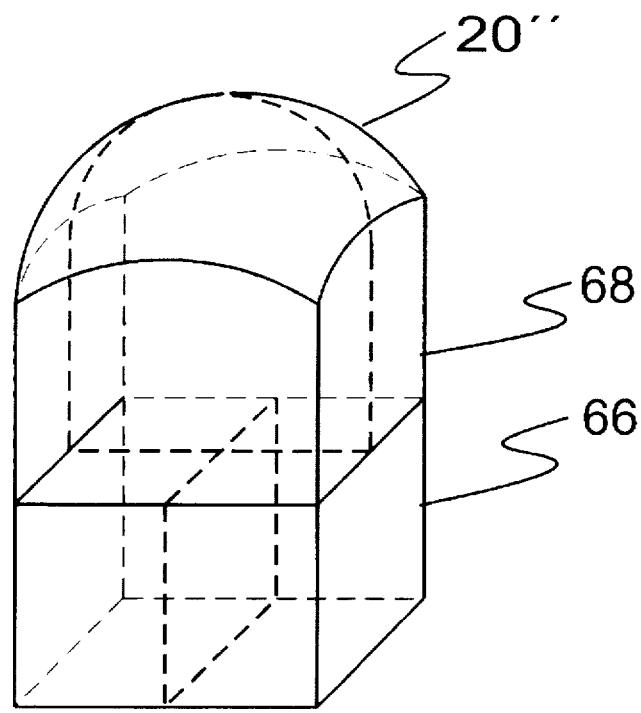
FIG. 5a depicts the quadaxial lens of the present invention with a curved exit surface to generate elliptical or, more specifically, circular spot geometries.
Figure 5B:
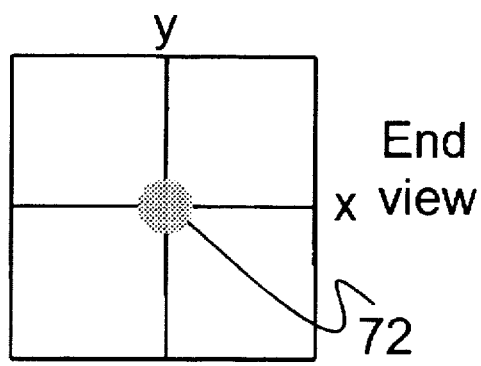
FIG. 5b is an end view of the quadaxially-graded coupler component shown in FIG. 5a, depicting the resulting circular spot, resulting from the use of the curved exit surface.

FIG. 5a depicts a quadaxial lens provided with a convex, spherical exit surface 20". Such a surface circularizes the focus spot 72, as shown in FIG. 5b.

Figure 5C:
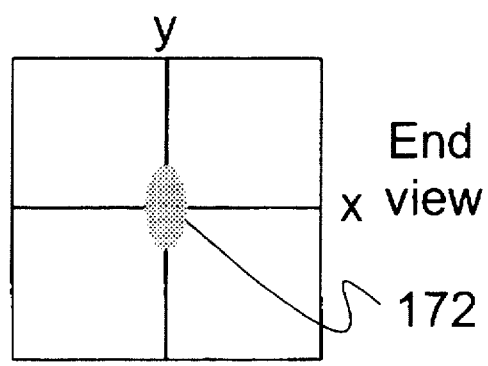
FIG. 5c is a view similar to that of FIG. 5b, but depicting an elliptical focus spot, resulting from the use of different change in index of refraction (Δn) values in the two biaxially-graded components.

In the situation in which the first biaxial element 66 has a first Δn and the second biaxial element 68 has a second, and different, Δn, the light is focused to an ellipse 172, as shown in FIG. 5c.

In any of the foregoing embodiments of the present invention, it appears that the preferred profile is a parabolic profile. The parabolic profile is preferred for replicating a concave curved entrance surface. The Δn employed may be any reasonable value, with the caveat that a smaller Δn only requires a larger overall lens size.

A very important set of additional features includes the placement of diffractive optical surfaces onto the surfaces of and or between the axially graded index of refraction elements to provide additional degrees of freedom to correct for chromatic aberration along the optical axis of the above described lens configurations and/or to provide for focusing and/or collimation of light through the above lenses in an additional dimension. Such a lens could be formed by placing the diffractive element onto a given surface in the substance of an epoxy material that is then cemented to the other axially graded index of refraction element of a biaxially graded index of refraction element with an optical cement that has an index of refraction significantly different from that of the epoxy material.

This permits the coupling of tunable lasers without changes in optical path difference (OPD) and provides the ability to focus light simultaneously in from two light sources in two or more directions: (a) through the optical axis; (b) at a 90 degree angle from the optical axis; and (c) at a 45° angle to the optical axis as enabled by the employment of the aforementioned diffractive and/or holographic optical elements.

Additionally, active materials whose refractive indices can be modulated to provide optically transparent signal or focal point switching functions may be added to the lenses disclosed above.

INDUSTRIAL APPLICABILITY

The quadaxially-graded optical element is expected to find use in a variety of applications for the gathering, focusing, collimating and coupling of light with or without airspace in which high numerical apertures and nearly even distributions of light intensity are desired and in which curved surfaces are not desired.

Thus, there has been disclosed a quadaxial lens. It will be readily apparent to those skilled in this art that various changes and modifications of an obvious nature may be made, and all such changes and modifications are considered to fall within the scope of the present invention, as defined by the appended claims.

What is claimed is:

1. A quadaxial lens comprising a first biaxial element and second biaxial element joined together, each biaxial element comprising two axially graded index of refraction sub-elements each sub-element having a gradient in index of refraction that begins at a lower value on one surface and ends at a higher value on an opposite surface, with both said subelement joined together at said surfaces having said higher value of index of refraction to form a high index interface, each biaxial element having entrance and exit surface which are perpendicular to an optic axis and to said high index interface, said exit surface of said first biaxial element being joined to said entrance surface of said second biaxial element, with one of said biaxial element rotated with respect to the other about said optic axis and with said first biaxial element configured to generate a line focus at its exit surface and second biaxial element configured to generate a spot focus at its exit surface, such that said quadaxial lens gather and focuses light to said spot with a substantially uniform distribution of light intensity from center to periphery of said spot.

2. The quadaxial lens of claim 1 wherein said first biaxial element is rotated 90 degrees with respect to said second biaxial element.

3. The quadaxial lens of claim 1 wherein said exit surface of said second of said second biaxial element is plano.

4. The quadaxial lens of claim 3 wherein said first biaxial element has a first change in index of refraction and wherein said second biaxial element has a second, and different, change in index of refraction, whereby said spot is rectangular.

5. The quadaxial lens of claim 4 wherein said first change in index of refraction and said second change in index of refraction are identical, whereby said spot is square.

6. The quadaxaial lens of claim 1 wherein said exit surface of said second biaxial element is curved.

7. The quadaxial lens of claim 6 wherein said first biaxial element has a first change in index of refraction and wherein said second biaxial element has a second, and different change in index of refraction, whereby said spot is elliptical.

8. The quadaxial lens of claim 7 wherein said first change in index of refraction and said second change in index of refraction are identical, whereby said spot is circular.

* * * * *